United States Patent
Liu et al.

(10) Patent No.: US 10,340,783 B2
(45) Date of Patent: Jul. 2, 2019

(54) APPARATUS AND METHOD FOR CONTROLLING PULSE OUTPUT

(71) Applicants: Nuctech Company Limited, Beijing (CN); Tsinghua University, Beijing (CN)

(72) Inventors: Yaohong Liu, Beijing (CN); Chuanxiang Tang, Beijing (CN); Xinshui Yan, Beijing (CN); Wei Jia, Beijing (CN); Jianjun Gao, Beijing (CN); Jinsheng Liu, Beijing (CN); Wei Yin, Beijing (CN); Xiying Liu, Beijing (CN); Hao Shi, Beijing (CN)

(73) Assignees: Nuctech Company Limited, Beijing (CN); Tsinghua University, Beijing (CN)

( * ) Notice: Subject to any disclaimer, the term of this patent is extended or adjusted under 35 U.S.C. 154(b) by 0 days.

(21) Appl. No.: 14/008,921

(22) PCT Filed: Dec. 28, 2012

(86) PCT No.: PCT/CN2012/001752
§ 371 (c)(1),
(2) Date: Sep. 30, 2013

(87) PCT Pub. No.: WO2013/097298
PCT Pub. Date: Jul. 4, 2013

(65) Prior Publication Data
US 2014/0320105 A1    Oct. 30, 2014

(30) Foreign Application Priority Data
Dec. 31, 2011 (CN) .......................... 2011 1 0457646

(51) Int. Cl.
*H02M 1/08* (2006.01)
*H03K 7/08* (2006.01)
*H03K 3/57* (2006.01)

(52) U.S. Cl.
CPC ............... *H02M 1/08* (2013.01); *H03K 3/57* (2013.01); *H03K 7/08* (2013.01)

(58) Field of Classification Search
CPC ................. H02M 3/07; H02M 3/018; H02M 2001/0077; H02M 1/088; H02M 1/08; H03K 7/08; H03K 3/57
See application file for complete search history.

(56) References Cited

U.S. PATENT DOCUMENTS

| 4,900,947 A | 2/1990 | Weiner et al. |
| 5,761,058 A | 6/1998 | Kanda et al. |

(Continued)

FOREIGN PATENT DOCUMENTS

| CN | 1206950 A | 2/1999 |
| CN | 101739974 A | 6/2010 |

(Continued)

OTHER PUBLICATIONS

Nguyen et al, May 2008, IEEE, IPMC 2008, 120-123.*

(Continued)

*Primary Examiner* — Jue Zhang
(74) *Attorney, Agent, or Firm* — Withrow & Terranova, P.L.L.C.

(57) ABSTRACT

The present invention provides a pulse modulating power source, which comprises: a plurality of discharging modules connected in series during discharging; a plurality of triggers corresponding to said plurality of discharging modules, wherein each trigger provides a trigger signal to the corresponding discharging module to turn it on; a control logic module for controlling the trigger signals so as to turn on (Continued)

said plurality of discharging modules successively with a time delay; an output terminal for outputting a voltage.

14 Claims, 5 Drawing Sheets

(56) References Cited

U.S. PATENT DOCUMENTS

| | | | |
|---|---|---|---|
| 2004/0090252 | A1 | 5/2004 | Rieven |
| 2006/0245217 | A1* | 11/2006 | Kirbie et al. ............. 363/60 |
| 2008/0036301 | A1 | 2/2008 | McDonald |
| 2012/0223583 | A1* | 9/2012 | Cooley et al. ............ 307/82 |

FOREIGN PATENT DOCUMENTS

| | | |
|---|---|---|
| CN | 102545687 A | 7/2012 |
| CN | 102545846 A | 7/2012 |
| CN | 202406058 U | 8/2012 |
| CN | 202772856 U | 3/2013 |
| JP | H05-055879 A | 3/1993 |
| JP | H09-047032 A | 2/1997 |
| JP | 2004-364452 A | 12/2004 |
| JP | 2008011595 A | 1/2008 |

OTHER PUBLICATIONS

Stanford Research Systems, 1994,1997,2000,2006,2017, Stanford Research Systems, Revision 3.0, 43.*
Zhao, Chun et al., "Repetition Rate Pulsed Power Supply for Triggered Switch Test," High Voltage Engineering, vol. 35, No. 1, Jan. 2009, pp. 82-86.
Zhou, Dan et al., "High Voltage Pulse Generator and Its Application in Optical-Electrical Dual Pulse LIBS," Dissertation Submitted for the Degree of Master, 2007, 67 pages.
International Search Report for PCT/CN2012/001752, dated Apr. 11, 2013, 4 pages.
Wang, Chuanwei et al., "Key Technology Research on All Solid State Repetitive Marx Generator" China Excellent Master's Theses Full-text Database Information Series, Document TM836-533(1), CPEL1154434N, Jun. 15, 2010, 47 pages.
First Office Action for Chinese Patent Application No. 20110457646.9, dated Jan. 30, 2014, 10 pages.
Second Office Action for Chinese Patent Application No. 20110457646.9, dated Sep. 9, 2014, 8 pages.
Casey, Jeffrey A., et al., "Solid-State Marx Bank Modulator for the Next Linear Collider," IEEE International Pulsed Power Conference, Digest of Technical Papers, vol. 1, Jun. 15-18, 2003, Dallas, Texas, IEEE, pp. 641-644.
Extended European Search Report for European Patent Application No. 12862173.7, dated Sep. 24, 2015, 8 pages.
Examination Report for European Patent Application No. 12862173.7, dated Feb. 9, 2018, 8 pages.
Notification of Reasons for Refusal for Japanese Patent Application No. 2014-549299, dated Jun. 25, 2015, 6 pages.
Written Opinion for Korean Patent Application No. 10-2014-7018779, dated Sep. 5, 2015, 11 pages.
Notice of Final Rejection for Korean Patent Application No. 10-2014-7018779, dated Mar. 28, 2016, 6 pages.
Third Office Action for Chinese Patent Application No. 201110457646.9, dated Mar. 24, 2015, 10 pages.
International Preliminary Report on Patentability for PCT/CN2012/001752, dated Jul. 1, 2014, 9 pages.
Written Opinion of the International Searching Authority for PCT/CN2012/001752, dated Apr. 11, 2013, 8 pages.

* cited by examiner

APPARATUS AND METHOD FOR CONTROLLING PULSE OUTPUT

This application is a 35 USC 371 national phase filing of International Application No. PCT/CN2012/001752, filed Dec. 28, 2012, which claims priority to Chinese national application 201110457646.9 filed Dec. 31, 2011, the disclosures of which are incorporated herein by reference in their entireties.

FIELD OF THE INVENTION

The present invention relates generally to pulse output control, and in particular to pulse output front edge control. Specifically, the present invention relates to controlling the output pulse front edge on a solid-state pulse modulating power source based on a MARX generator principle.

BACKGROUND OF THE INVENTION

A MARX generator is a way of realizing a pulse modulating power source, and it is a device that is charged in parallel and then discharged in series using capacitance. The MARX generator can realize nanosecond narrow pulse and a very high pulse frequency. A solid-state pulse modulating power source is a power source that uses a solid-state switch, e.g. IGBT (Insulating Gate Bi-polar Transistor), to perform pulse modulation. At present, the solid-state pulse modulating power sources that are based on the MARX generator principle and are applied to linear accelerators usually work in such a way as that all of the IGBTs are triggered simultaneously.

In a power source system having a magnetron as the load, owing to the impedance characteristic of the magnetron per se, a pulse front edge slope meeting a specific requirement is necessary in order to make the magnetron operate in a specific pulse current. FIG. 1 is a schematic drawing of a pulse current waveform when the pulse front edge slope meets the requirement. FIG. 2 is a schematic drawing of a pulse current waveform when the pulse front edge is too steep, in the figure, the top of the pulse has an obvious top drop phenomenon. FIG. 3 is a schematic drawing of a pulse current waveform when the pulse front edge is too flat, in the figure, the top of the pulse has an obvious top rise phenomenon. Besides, when the amplitude of the pulse current changes, the pulse front edge slope that can maintain the top of the pulse current waveform to be even and straight will also change, and a larger amplitude requires a steeper front edge slope.

To solve the problem of uneven pulse top, the commonly adopted solution at present is to connect an inductor in series to the pulse power source output. When the amplitude of the pulse current needs to be adjusted, the inductance of the inductor can be adjusted to match the impedance. This method has a defect, which is that when the pulse current amplitude needs to be adjusted frequently, adjusting the inductance will be a very tedious procedure; especially for solid-state pulse modulating power sources used on dual-energy accelerator products, because the pulse current amplitude changes alternately in each pulse period, the method of adjusting the inductance so as to adjust the pulse current amplitude cannot be realized in these products.

Hence, there is the need for a convenient control to the output pulse front edge so as to be better adapted to the magnetron load.

SUMMARY OF THE INVENTION

The present invention provides an apparatus and method for controlling a pulse output through successively delaying trigger signals.

According to one aspect of the present invention, a pulse modulating power source is provided, which comprises: a plurality of discharging modules connected in series during discharging; a plurality of triggers corresponding to said plurality of discharging modules, wherein each trigger provides a trigger signal to the corresponding discharging module to turn it on; a control logic module for controlling the trigger signals so as to turn on said plurality of discharging modules successively with a time delay; an output terminal for outputting a voltage.

According to another aspect of the present invention, a method of controlling a pulse output in a pulse modulating power source is provided, said pulse modulating power source including a plurality of discharging modules connected in series during discharging, said method comprises the steps of providing said plurality of discharging modules with successively delayed trigger signals to successively turn on said plurality of discharging modules; and outputting a discharge voltage.

In a preferred embodiment of the present invention, the present invention tries to obtain a good pulse output waveform on a solid-state pulse modulating power source based on a MARX generator principle through adjusting the delay time of turning on of each of the IGBT modules.

By means of the present invention, the pulse current amplitude can be adjusted without connecting an inductor in series to the output terminal of the pulse power source, thus the output pulse front edge and the uneven pulse top can be controlled and adjusted conveniently so as to be better adapted to, for example, the magnetron load.

BRIEF DESCRIPTION OF THE DRAWINGS

In order to facilitate a full understanding of the present invention, descriptions are given below in conjunctions with the drawings, wherein.

DETAILED DESCRIPTION OF THE INVENTION

FIGS. 1-8 discussed in the present invention and the various embodiments for describing the principle of the present invention in said patent document are only for the purpose of illustration, but they should not be construed as limiting the scope of the present invention in any way. Those skilled in the art shall understand that the principle of the present invention can be realized through any type of apparatus or system arranged properly.

Figure 4:
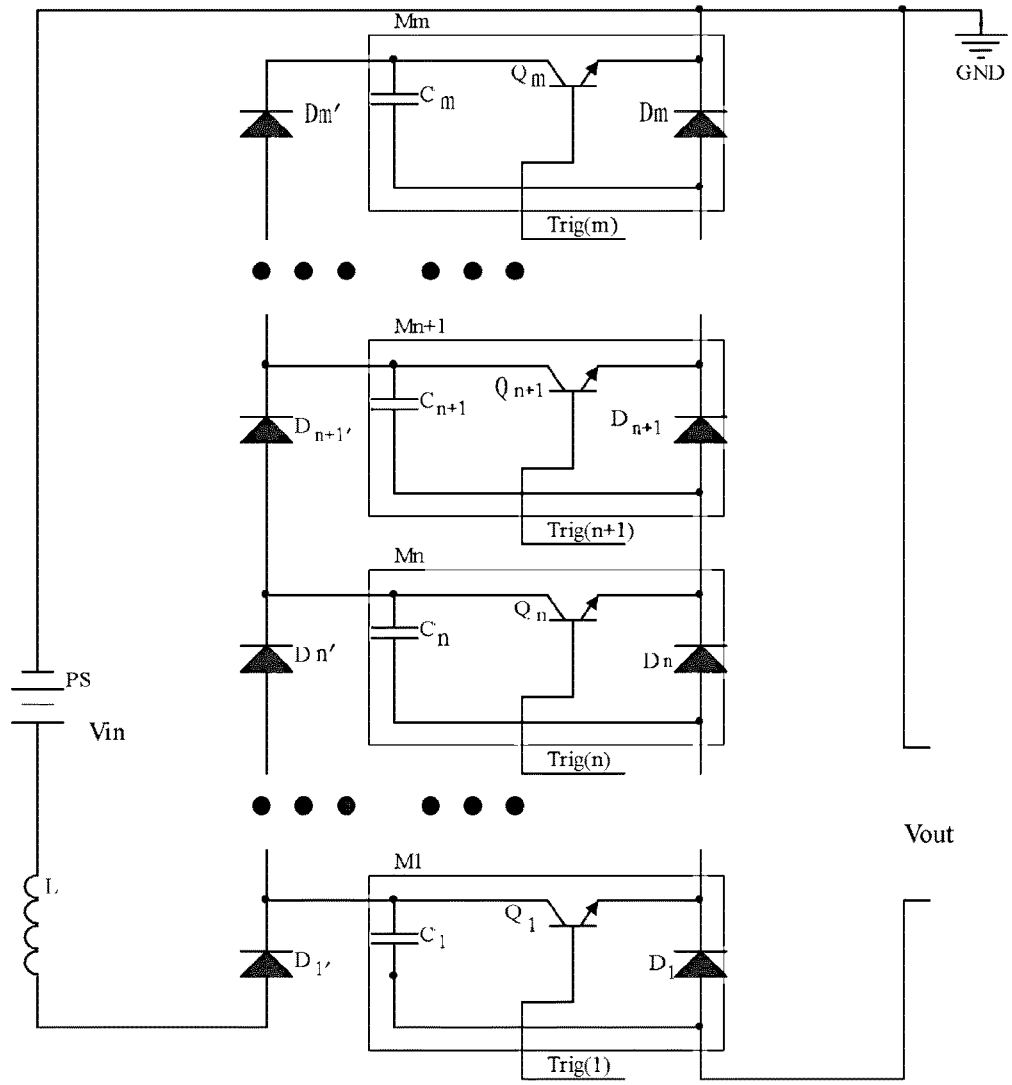
FIG. 4 is a schematic drawing of the principle of a currently common solid-state pulse modulating power source based on a MARX generator.

FIG. 4 is a schematic drawing of the principle of a currently common solid-state pulse modulating power source based on a MARX generator. In the figure, PS represents a high power DC stabilized voltage source, which is the power supply for the solid-state pulse modulating power source, and the supply voltage is Vin. M1~Mm are m IGBT modular units. Trig(1)~Trig(m) are trigger signals corresponding to IGBT module groups. Vout is a voltage of the output terminal of the solid-state pulse modulating power source.

During an interval of two times of triggering, the PS charges a capacitor C in an IGBT modular unit through a charging inductance L and a diode, thereby forming a capacitor array of parallel charging, and the voltage on the capacitor C is kept to be Vin until the next triggering comes. When the triggering comes, each of the IGBT modules is turned on, and the capacitors C on the modules form a series discharging loop through each IGBT modular unit, and the output voltage of the solid-state pulse modulating power source at the time is Vout=n*Vin, wherein n is a number of IGBT modules that is turned on currently.

Figure 5:
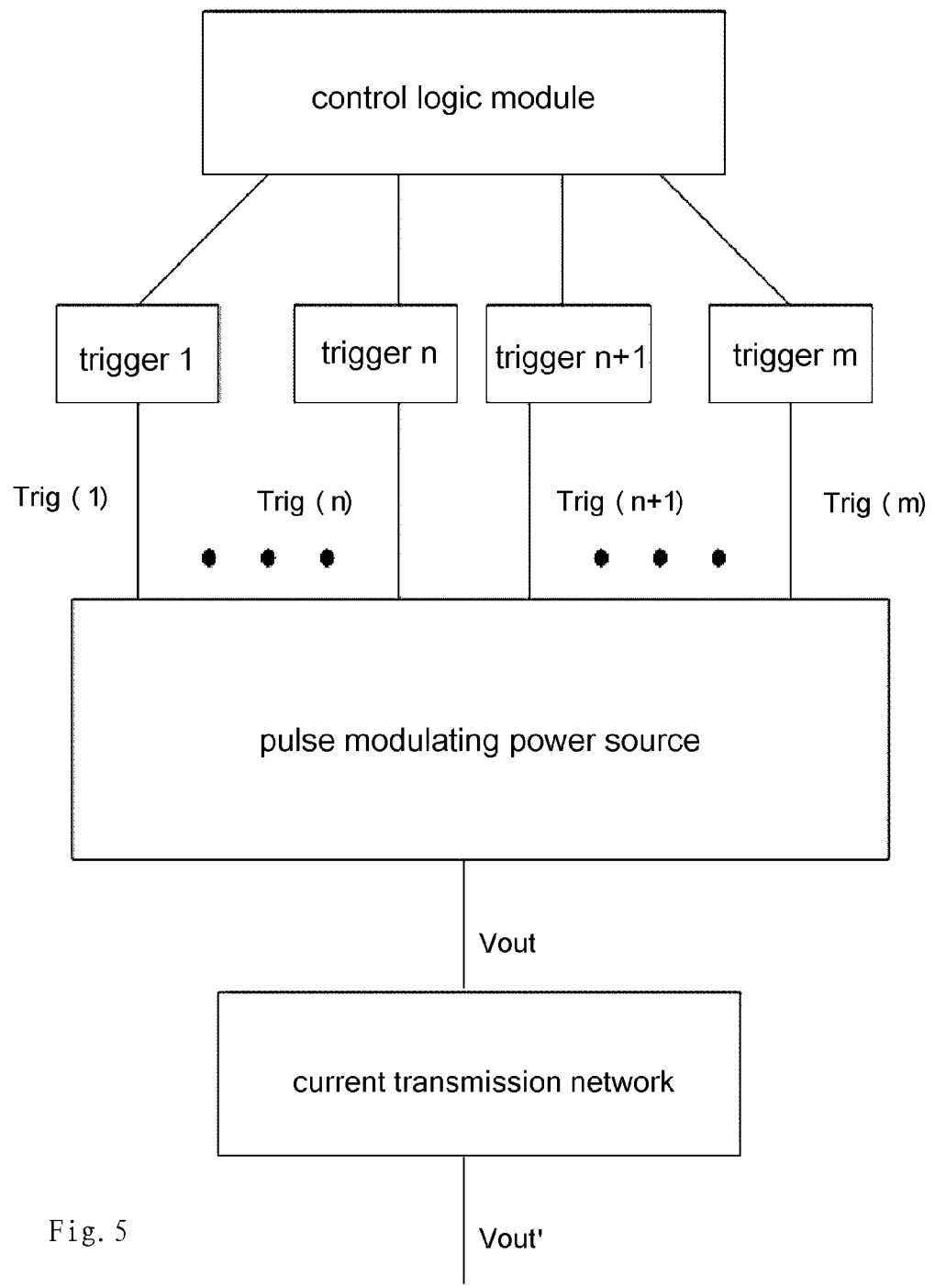
FIG. 5 is a schematic drawing of a solid-state pulse modulating power source based on a MARX generator according to one embodiment of the present invention.

FIG. 5 is a schematic drawing of a solid-state pulse modulating power source based on a MARX generator according to one embodiment of the present invention. The solid-state pulse modulating power source shown in FIG. 5 is, for example, a typical solid-state pulse modulating power source based on a MARX generator as shown in FIG. 4, wherein m triggers (trigger 1 . . . , trigger n, trigger n+1, . . . trigger m) provide trigger signals Trig(1), . . . Trig(n), Trig(n+1) . . . Trig(m) to the solid-state pulse modulating power source. Triggers 1~m are controlled by a control logic module which controls the trigger signals Trig(1)~Trig(m) generated by triggers 1~m so as to successively turn on m IGBT modular units in the solid-state pulse modulating power source with a time delay.

When the triggering comes, the IGBT modular units M1~Mm in the solid-state pulse modulating power source based on the MARX generator receive the successively delayed trigger signals Trig(1)~Trig(m) and turn them on successively with a time delay. Thus, a stepped output front edge Vout is generated at the output terminal of the solid-state pulse modulating power source. Then after being filtered by a current transmission network, a smooth output Vout' can be obtained at a magnetron load terminal (not shown).

Figure 1:
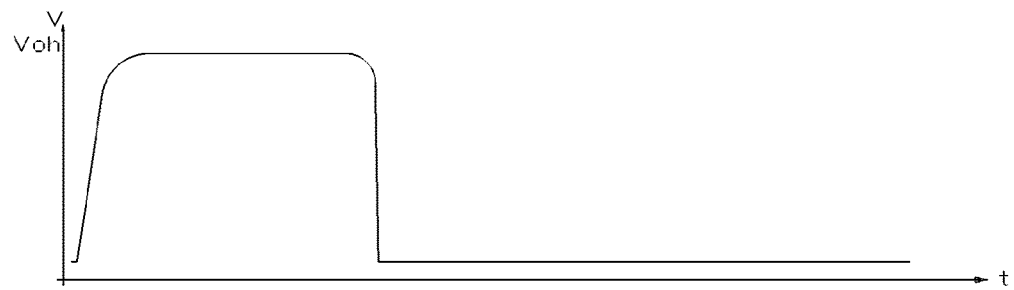
FIG. 1 is a schematic drawing of a pulse current waveform when the pulse front edge slope meets the requirement.
Figure 2:
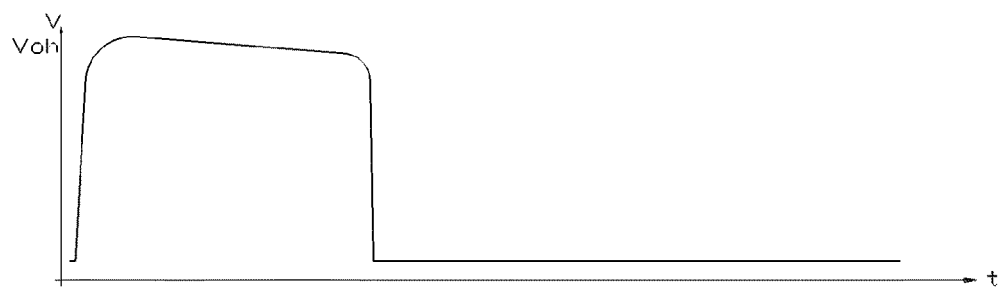
FIG. 2 is a schematic drawing of a pulse current waveform when the pulse front edge is too steep.
Figure 3:
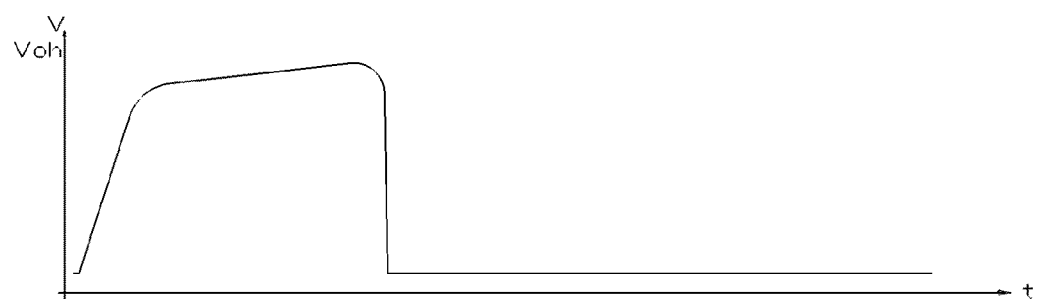
FIG. 3 is a schematic drawing of a pulse current waveform when the pulse front edge is too flat.

The control logic module controls triggers 1~m, so that triggers 1~m output non-delayed Trig(1), . . . , Trig(n) with a time delay of $\Delta t(n-1)$, Trig(n+1) with a time delay of $\Delta t(n)$, . . . , Trig(m) with a time delay of $\Delta t(m-1)$. The control logic module can control the duration of each delay time $\Delta t1$~$\Delta t(m-1)$ so as to obtain a pulse front edge slope meeting a specific requirement. In a preferred embodiment of the present invention, when the pulse front edge is too steep, the pulse top will have an obvious top drop phenomenon as shown in FIG. 2. Then the control logic module increases the delay time $\Delta t1$~$\Delta t(m-1)$ to obtain a pulse front edge of a pulse output with reduced slope. In another preferred embodiment of the present invention, when the pulse front edge is too flat, the pulse top will have an obvious top rise phenomenon as shown in FIG. 3. Then the control logic module reduces the delay time $\Delta t1$~$\Delta t(m-1)$ to obtain a pulse front edge of a pulse output with increased slope.

Although FIG. 5 illustrates an example of the solid-state pulse modulating power source according to the present invention, various changes can be made to FIG. 5. The solid-state pulse modulating power source based on the MARX generator as shown in FIG. 5 is merely one way of realizing the pulse modulating power source. In fact, the present invention can be applied to any solid-state pulse modulating power source that discharges in series. In addition, the solid-state switch in the solid-state pulse modulating power source is not limited to the IGBT (Insulating Gate Bi-polar Transistor) solid-state switch, but it can be any device or means that is suitable for discharging modules that are connected in series during discharging. Those skilled in the art can learn after reading this description that the present invention can not only adjust the pulse front edge slope in the solid-stage pulse modulating power source based on the MARX generator, but also eliminate the problem of uneven pulse top in any solid-state pulse modulating power source that discharges in series.

Figure 6:
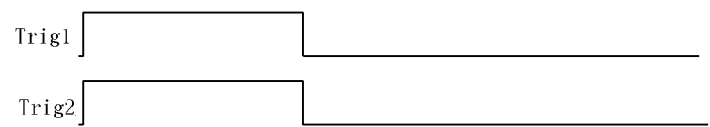
FIG. 6 is a schematic drawing of the work schedule of the triggering of a solid-state pulse modulating power source and the pulse output without front edge control.
Figure 6:
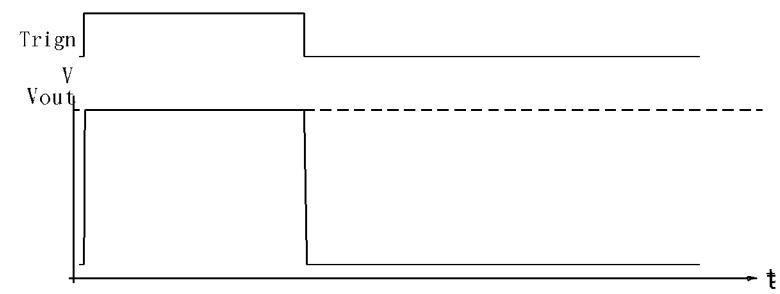

FIG. 6 is a schematic drawing of the work schedule of the triggering of a solid-state pulse modulating power source and the pulse output without front edge control. In this operation mode, there is no time delay among trigger signals Trig(1)~Trig(m), all IGBT modules are triggered simultaneously and turned on simultaneously. The time in which the output voltage rises is only dependent on parameters of the IGBT modules and parameters of the output circuit.

Figure 7:
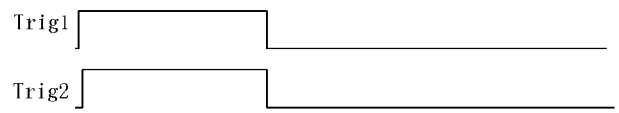
FIG. 7 is a schematic drawing of the work schedule of the triggering of a solid-state pulse modulating power source and the pulse output having front edge control.
Figure 7:
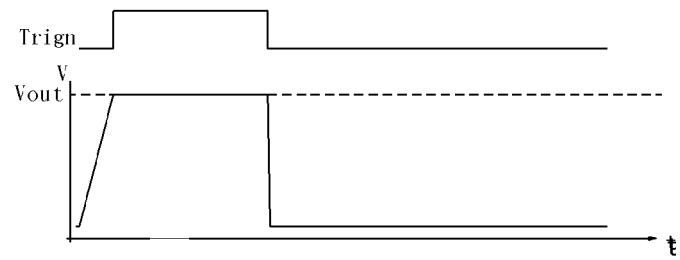
Figure 8:
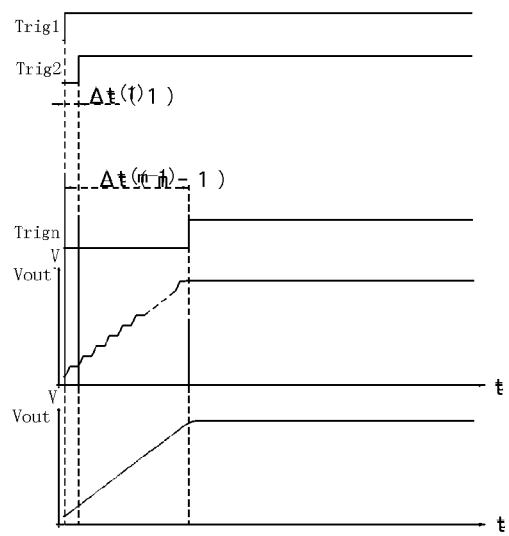
FIG. 8 is a schematic drawing of details of the pulse front edge shown in FIG. 7.

FIG. 7 is a schematic drawing of the work schedule of the triggering of a solid-state pulse modulating power source and the pulse output having front edge control, and FIG. 8 is a schematic drawing of details of the pulse front edge shown in FIG. 7.

In FIG. 8, trigger signals Trig(n+1) . . . Trig(m) of each of the IGBT modules are not turned on simultaneously, instead they are successively turned on with a time delay, thus a stepped output front edge Vout will be generated at the output terminal of the power source, and after being filtered by the current transmission network, a smooth output Vout' can be obtained at the magnetron load terminal. By adjusting the delay time $\Delta t1$~$\Delta t(m-1)$ for triggering of each IGBT, the front edge slope of Vout' can be changed.

In summary, the apparatus and method for controlling the pulse output through successively delaying the trigger signals as provided by the present invention does not require to connect an inductor in series to the output terminal of the pulse power source, thereby avoiding problems that will be caused by connecting an inductor in series.

Although for the purpose of presenting the basic structure of the present invention, some constructions of the structure have been described, those skilled in the art shall understand that other variations that still fall within the scope of the appended claims are possible. Although the present invention has been described according to the embodiments that have been considered to be the most practical and preferred at present, it shall be understood that the present invention is not limited to the disclosed embodiments, on the contrary, it intends to cover various modified and equivalent solutions that fall into the spirit and scope of the appended claims.

What is claimed is:

1. A pulse modulating power source, which comprises:
   a plurality of discharging modules all connected in series during discharging;
   a plurality of triggers corresponding to said plurality of discharging modules such that every discharging module of said plurality of discharging modules has a trigger, wherein each trigger provides a trigger signal to a corresponding discharging module to turn the corresponding discharging module on;

a control logic module for controlling the trigger signals so as to turn on said plurality of discharging modules successively with a time delay thereby setting each trigger of the plurality of triggers with the time delay, wherein each discharging module of said plurality of discharging modules separately turns on with the time delay and the control logic module is configured to adjust the time delay according to $\Delta t1 \sim \Delta t(m-1)$ to adjust the slope of the output voltage; and an output terminal for outputting a voltage, wherein the output terminal is not connected in series with an inductor.

2. The pulse modulating power source according to claim 1, wherein said pulse modulating power source is based on a MARX generator.

3. The pulse modulating power source according to claim 2, wherein said output terminal generates a stepped output front edge.

4. The pulse modulating power source according to claim 3, wherein said stepped output front edge is smoothed through a current output network.

5. The pulse modulating power source according to claim 1, wherein the discharging module is an insulated-gate bipolar transistor (IGBT) module.

6. The pulse modulating power source according to claim 1, wherein when a top drop appears at a pulse top, the time delay is increased.

7. The pulse modulating power source according to claim 1, wherein when a top rise appears at a pulse top, the time delay is reduced.

8. A method of controlling a pulse output in a pulse modulating power source, the pulse modulating power source having a plurality of discharging modules all connected in series during discharging and a plurality of triggers corresponding to the plurality of discharging modules such that every discharging module of the plurality of discharging modules has a trigger, wherein each trigger provides a trigger signal to a corresponding discharging module to turn the corresponding discharging module on, the method comprising:

controlling the trigger signals via a control logic module of the pulse modulating power source so as to turn on the plurality of discharging modules successively with a time delay thereby setting each trigger of the plurality of triggers with the time delay, wherein each discharging module of the plurality of discharging modules separately turns on with the time delay and the control logic module adjusts the time delay according to $\Delta t1 \sim \Delta t(m-1)$ to adjust the slope of the output voltage; and outputting a voltage via an output terminal of the pulse modulating power source, wherein the output terminal is not connected in series with an inductor.

9. The method according to claim 8, wherein said pulse modulating power source is based on a MARX generator.

10. The method according to claim 9, wherein the output terminal generates a stepped output front edge.

11. The method according to claim 10, further comprising smoothing the stepped output front edge.

12. The method according to claim 8, wherein a discharging module of the plurality of discharging modules is an insulated-gate bipolar transistor (IGBT) module.

13. The method according to claim 8, further comprising increasing the time delay when a top drop appears at a pulse top.

14. The method according to claim 8, further comprising reducing the time delay when a top rise appears at a pulse top.

* * * * *